United States Patent
Takagi (10) Patent No.: US 7,873,206 B2
(45) Date of Patent: Jan. 18, 2011

(54) REGISTRATION DETECTION SYSTEM

(75) Inventor: Makoto Takagi, Yokohama (JP)

(73) Assignee: Nikon Corporation, Tokyo (JP)

( * ) Notice: Subject to any disclaimer, the term of this patent is extended or adjusted under 35 U.S.C. 154(b) by 985 days.

(21) Appl. No.: 11/661,398

(22) PCT Filed: Oct. 17, 2005

(86) PCT No.: PCT/JP2005/019048

§ 371 (c)(1),
(2), (4) Date: Feb. 28, 2007

(87) PCT Pub. No.: WO2006/046427

PCT Pub. Date: May 4, 2006

(65) Prior Publication Data

US 2008/0107327 A1 May 8, 2008

(30) Foreign Application Priority Data

Oct. 26, 2004 (JP) ............................ 2004-310918

(51) Int. Cl.
*G06K 9/00* (2006.01)
(52) U.S. Cl. .................................................. 382/151
(58) Field of Classification Search ................ None
See application file for complete search history.

(56) References Cited

U.S. PATENT DOCUMENTS 6,553,137 B1 * 4/2003 Tomimatu ................... 382/148
7,433,039 B1 * 10/2008 Levinski et al. .............. 356/401
2005/0205776 A1 * 9/2005 Dana et al. .................. 250/306

FOREIGN PATENT DOCUMENTS

| JP | 11-31299 A | 2/1999 |
|---|---|---|
| JP | 11-186358 A | 7/1999 |
| WO | 03/077291 A1 | 9/2003 |
| WO | 2005/083756 A1 | 9/2005 |

* cited by examiner

*Primary Examiner*—Brian P Werner
(74) *Attorney, Agent, or Firm*—Arent Fox LLP (57) ABSTRACT

A registration detection system performing registration-detecting each substrate in a lot without lowering an original throughput of a lithography system and maintaining high accuracy usable for the correction of an exposure process. Therefore, registration detection 5 system includes: the first detection apparatus installed on a pathway to a collection in a transport container of substrates taken out of transport container, after passing at least exposure process and a development process, registration-detects substrates after passing development process, according to stipulated criteria, and outputs results of registration detection for use in correction of exposure process; the second detection apparatus outside 10 the pathway, and registration-detecting substrate when substrate after passing the first detection apparatus and collected in the transport container is taken out of transport container again; and a correction unit comparing detection results by the first and the second detection apparatuses to correct registration detection criteria in the first detection apparatus.

19 Claims, 3 Drawing Sheets

FIG. 4

REGISTRATION DETECTION SYSTEM

CROSS-REFERENCE TO RELATED APPLICATION

This application is a U.S. National Stage application claiming the benefit of prior filed International Application Number PCT/JP2005/019048, filed Oct. 17, 2005, in which the International Application claims a priority date of Oct. 26, 2004 based on prior filed Japanese Application Number 2004-310918, the entire contents of which are incorporated herein by reference.

TECHNICAL FIELD

The present invention relates to a registration detection system that performs registration detection of a plurality of patterns formed on different layers of a substrate, and more particularly, to a registration detection system suitable for the registration detection in manufacturing processes of semiconductor devices, liquid crystal display devices, and the like.

BACKGROUND ART

In manufacturing processes of semiconductor devices, liquid crystal display devices, and the like, a circuit pattern is transferred to a resist layer after a known lithography process, and by performing processing such as etching via the resist pattern, the circuit pattern is transferred to a predetermined material film (pattern forming process). Then, by repeatedly executing the pattern forming process many times, the circuit patterns of various material films are stacked on a substrate (a semiconductor wafer or a liquid crystal substrate), whereby circuits of the semiconductor device or the liquid crystal display device are formed.

Further, in the above-described manufacturing processes, for accurate overlay of the circuit patterns of the various material films (for improving a product yield), detection of positional discrepancy of the resist pattern on the substrate follows the lithography process and precedes the processing process, during each of the pattern forming processes (see, for example, Japanese Unexamined Patent Application Publication No. Hei 11-31229). This is overlay inspection of a circuit pattern of a base layer formed in an immediately preceding pattern forming process (hereinafter, referred to as a "base pattern") and the resist pattern. The result of the overlay inspection is used for quality judgment of the substrate and so on.

Generally, the registration detection is performed in a stand-alone apparatus independent from a lithography system (including an exposure apparatus). Therefore, substrates as detection objects after passing through the lithography process are transported to a registration detection apparatus while put in a transport container such as a cassette (that is, in a unit of lot). Then, in the registration detection apparatus, part of the substrates in the lot are sampled to undergo the registration detection, and the result of the registration detection is outputted in a unit of lot. Thereafter, quality of the substrates is judged in a unit of lot, and the substrates are transported in a unit of lot to a subsequent process (processing process or the like if judged as good, or to a reproduction process or a discard process if judged as bad.

Further, the result of the registration detection for some lot A is not only used for the quality judgment of the lot A but also fed back to the exposure process in the lithography process to be used for the correction of the exposure process for a subsequent lot B (the same product name and process name as those of the lot A), in order to improve a nondefective ratio of the subsequent lot B.

The correction of the exposure process is processing to finely adjust parts (an alignment system, an AF system, and so on) of the exposure apparatus in advance to reduce discrepancy in position and size between a latent image of a circuit pattern formed on a mask (reticle) and a base pattern (hereinafter, referred to as a "process offset") when the latent image is imaged on a resist layer. The process offset of the exposure process varies little by little in accordance with a time-dependent change of the parts of the exposure apparatus and also varies depending on the state of the base layer of each substrate. Therefore, to avoid an increase in the process offset, the correction of the exposure process is required.

As a result of the correction of the exposure process, a latent image with a small process offset is imaged on the resist layer in the exposure process for the subsequent lot B. Then, after the development process, a resist pattern according to the latent image is formed on the base pattern, and the registration state of the resist pattern in the subsequent lot B also becomes good. The result of the registration detection for the lot B is fed back to the exposure process to be used for the correction of the exposure process for a subsequent lot C, similarly to the above.

In this manner, conventionally, the detection result outputted in a unit of lot from the stand-alone registration detection apparatus is fed back to the exposure process, and based on the result of the registration detection on some lot, the exposure process for a subsequent lot is corrected, and such correction of the exposure process is repeated in a unit of lot. Therefore, in the lithography process for a plurality of lots with the same product name and the same process name, it is possible to reduce the process offset of the exposure process every time a lot is changed, so that an increase in the process offset can be avoided.

DISCLOSURE OF THE INVENTION

Problems to be Solved by the Invention

In a case where the detection result outputted in a unit of lot from the stand-alone registration detection apparatus is fed back to the exposure process, the exposure process is corrected in a unit of lot as described above, and is not corrected in a unit of each substrate in the lot. In the future, further progress in microfabrication of circuit patterns in accordance with higher integration of semiconductor devices and the like will create a demand for higher registration accuracy, and therefore, delicate correction of the exposure process will be required, for example, for each substrate.

To correct the exposure process for each substrate without lowering a throughput, it is necessary to install the registration detection apparatus inside the lithography system (including the exposure apparatus), to provide the registration detection apparatus as an as an in-line apparatus. In this case, due to the restriction of space for built-in installation, it is difficult to install the stand-alone apparatus as it is, and a driving part, a vibration isolation system, and so on of a detection stage have to be downsized. Besides, it is necessary to take some measure to reduce a time required per one substrate without reducing the number of measurement points of each substrate.

A possible measure here is to reduce the time required for each of the measurement points of the substrate (that is, to decrease measurement items). Among measurement items at each of the measurement points in the stand-alone apparatus, measurement relating to the registration detection itself can not be omitted, but measurement relating to the setting of registration detection criteria (for example, an error component (TIS value) and the like arising from the apparatus) can be omitted. However, if the latter measurement is simply omitted, a time-dependent change of accuracy of the registration detection becomes problematic, and high accuracy usable for the correction of the exposure process cannot be maintained.

It is an object of the present invention to provide registration detection system which is capable of performing registration detection of each substrate in a lot without lowering an original throughput of a lithography system and is capable of maintaining high accuracy usable for the correction of an exposure process.

Means for Solving the Problems

A registration detection system of the present invention includes: a first detection apparatus that is installed on a pathway to a collection in a transport container of substrates that are taken out of the transport container, after passing at least through an exposure process and a development process, performs registration detection of a resist pattern and a base pattern of the substrates after passing through the development process, in accordance with stipulated criteria, and outputs results of the registration detection for use in correction of the exposure process; a second detection apparatus situated outside of the pathway, and performing registration detection of the resist pattern and the base pattern of the substrates; and a criteria correction unit that compares the results of the registration detection by the first detection apparatus and results of the registration detection by the second detection apparatus and corrects the criteria for the registration detection by the first detection apparatus.

Further, in the registration detection system described above, the first detection apparatus includes: a memory unit that stores, in advance, an error component arising from the first detection apparatus; a first acquisition unit that acquires an image of a measurement point of the substrate, with the substrate in an attitude at a stipulated orientation; a first calculation unit that calculates a registration discrepancy amount at the measurement point based on the image; and a first correction unit that corrects the registration discrepancy amount based on the error component stored in the memory unit, and the second detection apparatus includes: a second acquisition unit that acquires a first image of the measurement point of the substrate with the substrate in an attitude at a stipulated orientation, and a second image of the measurement point with the substrate rotated by an angle of 180 degrees from the stipulated orientation; a second calculation unit that calculates an error component arising from the second detection apparatus based on both of the first image and the second image; a third calculation unit that calculates a registration discrepancy amount at the measurement point based on the first image or the second image; and a second correction unit that corrects the registration discrepancy amount based on the error component calculated by the second calculation unit, and the criteria correction unit compares the results of the registration detection performed by the first detection apparatus and the results of the registration detection performed by the second detection apparatus, and corrects the error component stored in the memory unit, out of the registration detection criteria employed by the first detection apparatus.

Further, in the registration detection system described above, the first detection apparatus and the second detection apparatus respectively perform the registration detection at one or more of the same measurement points of the substrate, and the criteria correction unit calculates a difference between the two registration discrepancy amounts corrected by the first correction unit and the second correction unit at each of the same measurement points, with the registration discrepancy amount corrected by the first correction unit used as the registration detection result for the first detection apparatus, and the registration discrepancy amount corrected by the second correction unit used as the registration detection result for the second detection apparatus, when comparing the registration detection results of the first detection apparatus with those of the second detection apparatus, and corrects the error component stored in the memory unit based on the difference.

Further, in the registration detection system described above, the first detection apparatus is placed inside an application/development apparatus that applies resist prior to the exposure process and develops the resist after the exposure process, and the second detection apparatus is placed outside the application/development apparatus.

EFFECT OF THE INVENTION

According to the registration detection system of the present invention, it is possible to perform registration detection of each substrate in a lot without lowering an original throughput of a lithography system and to maintain high accuracy usable for the correction of an exposure process.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

BEST MODE FOR CARRYING OUT THE INVENTION

Hereinafter, an embodiment of the present invention will be described in detail by using the drawings.

Figure 1:
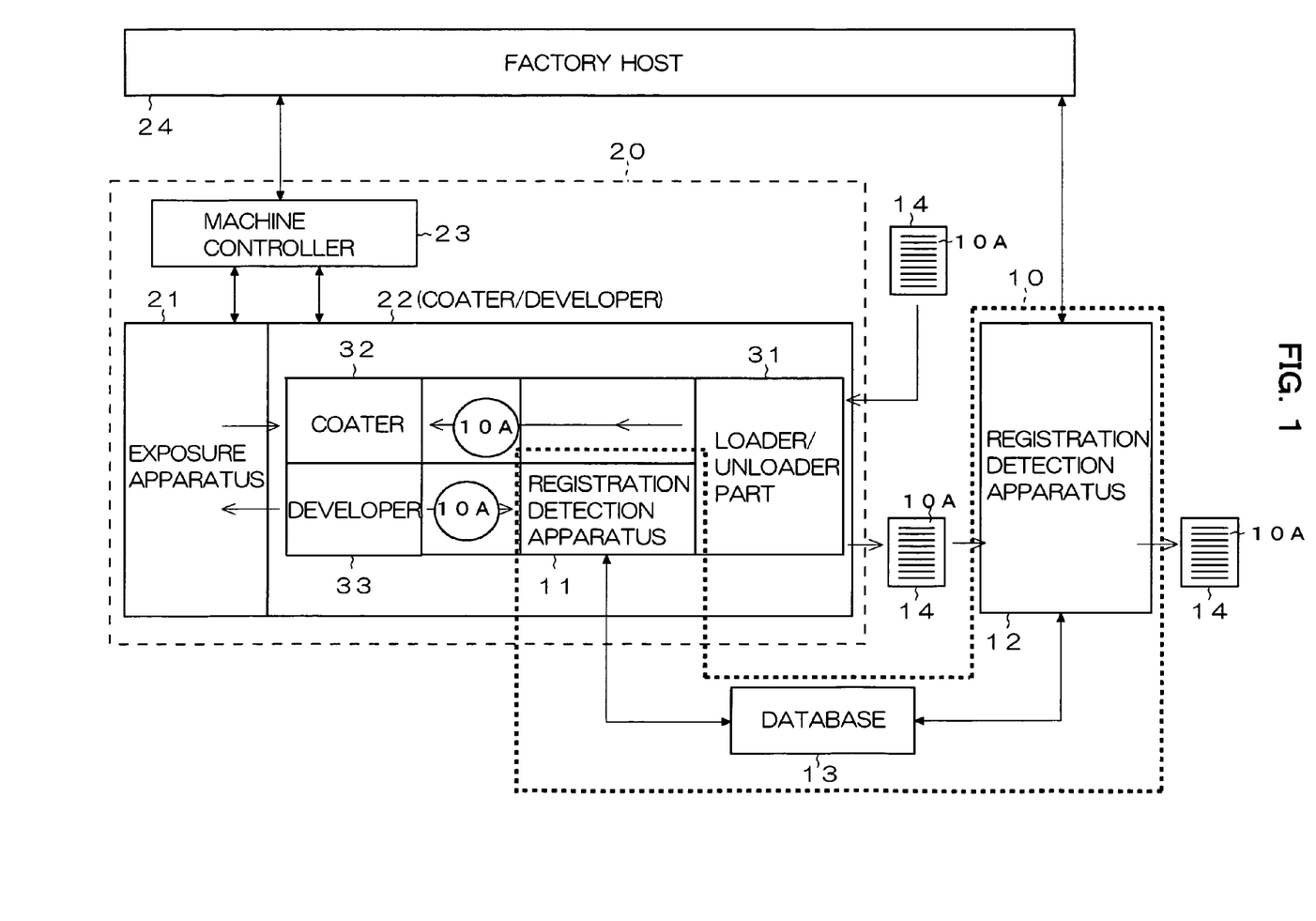
[FIG. 1] is a block diagram showing the structure of a registration detection system 10 of this embodiment.

As shown in FIG. 1, a registration detection system 10 of this embodiment includes: a registration detection apparatus 11 installed in a lithography system 20; a stand-alone registration detection apparatus 12 independent from the lithography system 20; and a database 13. The registration detection system 10 performs registration detection of a plurality of patterns formed on different layers of substrates 10A (semiconductor wafers, liquid crystal substrates, and the like) in manufacturing processes of semiconductor devices, liquid crystal display devices, and so on.

Here, the substrates 10A are transported to the lithography system 20 while put in a transport container 14 such as a cassette (that is, in a unit of lot), and after passing through a lithography process (to be described later) there, are transported to the stand-alone registration detection apparatus 12 while put in the transport container 14 again. The transport container 14 is thus moved by an automatic transport apparatus (not shown) or an operator. The transport container 14 is capable of housing a plurality of (for example 25 pieces of) the substrates 10A, and is sometimes called a carrier.

The lithography system 20 will be described before the registration detection system 10 of this embodiment is concretely described.

In the lithography system 20, an exposure apparatus 21 and a coater/developer 22 are adjacently installed, and a transport mechanism (not shown) of the substrates 10A is installed therebetween. In the coater/developer 22, a loader/unloader part 31, a coater 32, and a developer 33 are mounted, and further the built-in registration detection apparatus 11 in the registration detection system 10 of this embodiment is mounted, and the transport mechanism (not shown) of the substrates 10A is also installed. Thus, inside the lithography system 20, the apparatuses (11, 21, 31 to 33) are mutually in-line connected by the not-shown transport mechanism.

In the lithography system 20, the loader/unloader part 31 is an apparatus for loading and unloading the transport container 14 housing the substrates 10A. The coater 32 is an apparatus which coats each of the substrates 10A in the transport container 14 (that is in a lot) with resist before an exposure process in the exposure apparatus 21. The developer 33 is an apparatus to develop the resist of each of the substrates 10A after the exposure process. The built-in registration detection apparatus 11 is an apparatus to perform the registration detection (to be described in detail later) of the substrates 10A after a development process. Further, the exposure apparatus 21 is an apparatus to image a latent image of a circuit pattern formed on a mask (reticle), on a resist layer of each of the substrates 10A.

In the lithography system 20 as structured above, when the transport container 14 is carried into the loader/unloader part 31, each of the substrates 10A taken out from the transport container 14 is transported to the exposure apparatus 21 after passing through a resist coating process in the coater 32, is transported to the built-in registration detection apparatus 11 after passing through the exposure process in the exposure apparatus 21 and the development process in the developer 33, and is collected in the transport container 14 after passing through a detection process in the registration detection apparatus 11.

The built-in registration detection apparatus 11 is installed in the lithography system 20 to correct the exposure process substrate by substrate. Installing the registration detection apparatus 11 in the lithography system 20 makes it possible to perform the registration detection of the substrate 10A during a period in which the substrate 10A taken out from the transport container 14 passes through the lithography process (the resist coating process, the exposure process, the development process, and so on) to be thereafter collected in the transport container 14, which makes it possible to feed back the result of the registration detection to the exposure process.

The correction of the exposure process is processing to finely adjust parts (an alignment system, an AF system, and so on) of the exposure apparatus 21 in advance so as to reduce a process offset between a latent image of a circuit pattern and a base pattern when the latent image is imaged on the resist layer. The process offset of the exposure process varies little by little in accordance with a time-dependent change of the parts of the exposure apparatus 21, and also varies depending on the state of the base layer of each of the substrates 10A. Incidentally, the state of the base layer of the substrate 10A is influenced by a time-dependent change or the like of a deposition apparatus and a CMP apparatus and is often different among the substrates 10A. Therefore, as the microfabrication of circuit patterns further progresses in accordance with higher integration of semiconductor devices and the like, the substrate-by-substrate correction of the exposure process becomes necessary.

A machine controller 23 is connected, as an upper-order apparatus, to the exposure apparatus 21 and the coater/developer 22. The machine controller 23 controls the exposure apparatus 21 and the coater/developer 22 based on instructions from a factory host 24 to instruct the contents of processing in the apparatuses (11, 21, 31~33), the timing of the loading/unloading of the substrates 10A, the correction of the exposure process, and so on. The factory host 24 is in charge of process control of the whole factory (including the lithography system 20 and the registration detection system 10 of this embodiment).

Next, the registration detection system 10 of this embodiment will be concretely described.

As described above, the built-in registration detection apparatus 11 is disposed in the coater/developer 22 and is installed on a pathway where the substrate 10A taken out from the transport container 14 passes through the lithography process to be collected in the transport container 14. Further, the stand-alone registration detection apparatus 12 is disposed outside the coater/developer 22 (that is, outside the pathway). Further, the built-in registration detection apparatus 11 is connected to the database 13 via a not-shown communication means and the stand-alone registration detection apparatus 12 is also connected to the database 13 via a not-shown communication means, whereby a network is formed as a whole.

Both of the substrate 10A as an object of detection by the built-in registration detection apparatus 11 and the substrate 10A as an object of detection by the stand-alone registration detection apparatus 12 have undergone the development and have resist patterns formed on surfaces thereof. Then, the registration detection of the resist pattern and a base pattern in the substrate 10A is performed outside and inside the lithography system 20 by the built-in registration detection apparatus 11 and the stand-alone registration detection apparatus 12.

Figure 2:
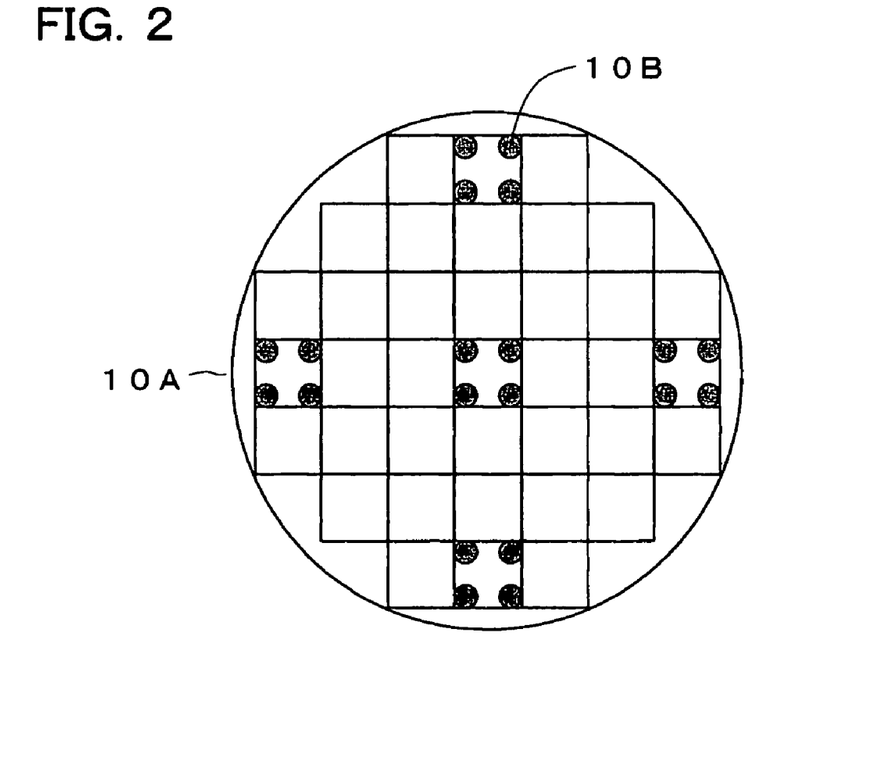
[FIG. 2] is a view to explain measurement points 10B of a substrate 10A.

Further, many measurement points are prepared in each of the substrates 10A for the registration detection. Positions of the measurement points are, for example, four corners of each shot area of the substrate 10A. At each of the measurement points, a resist mark representing a reference position of the resist pattern and a base mark representing a reference position of the base pattern are formed. In the registration detection by the registration detection system 10 of this embodiment, a relative discrepancy amount (registration discrepancy amount) between the resist mark and the base mark is found at each of the 20 measurement points 10B shown in FIG. 2 out of many measurement points of the substrate 10A. That is, the same number of the measurement points of the substrate 10A are set for the built-in registration detection apparatus 11 and for the stand-alone registration detection apparatus 12, and the both perform the registration detection at one or more (for example, 20) of the same measurement points 10B of the substrate 10A.

Figure 3:
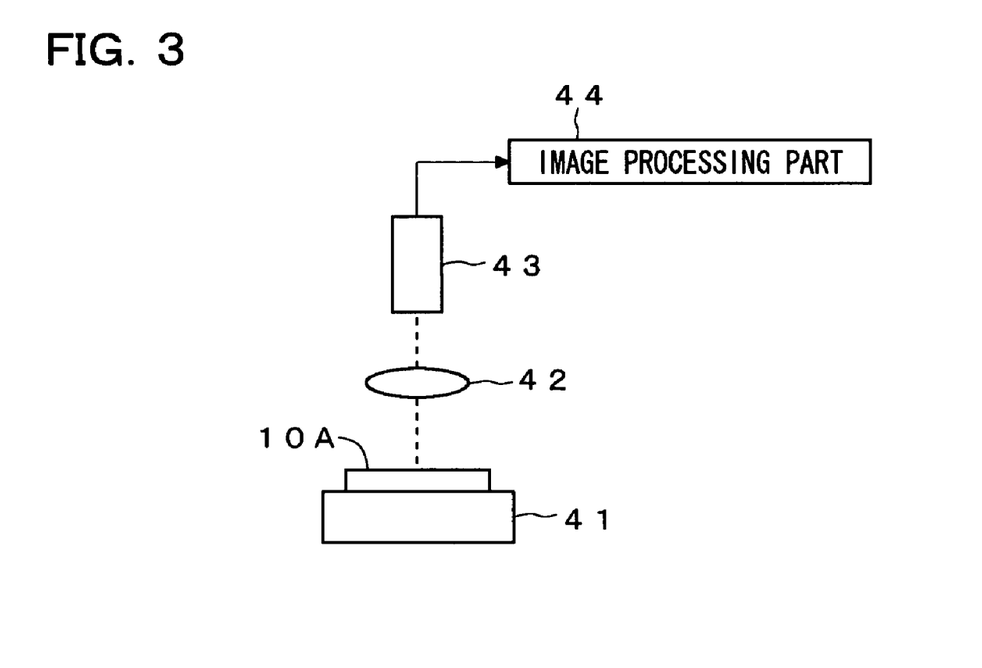
[FIG. 3] is a view showing the schematic structure of a built-in registration detection apparatus 11 and a stand-alone registration detection apparatus 12.
Figure 4:
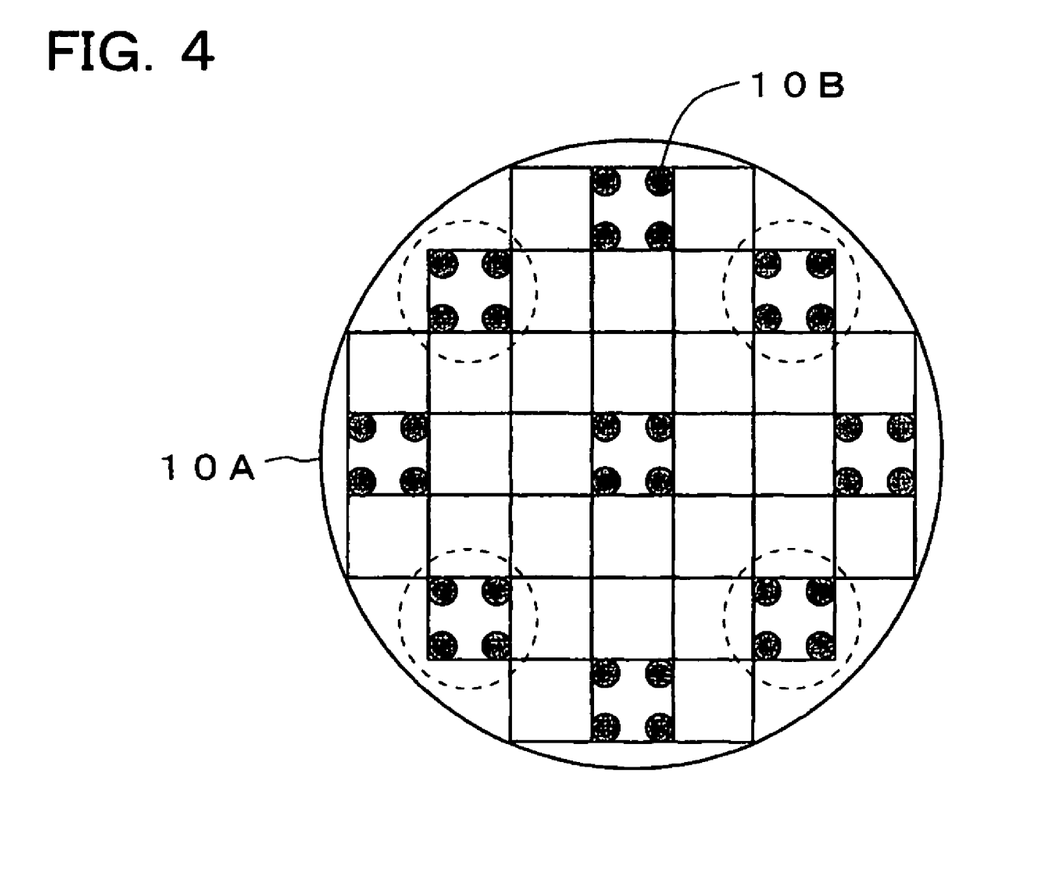
[FIG. 4] is a view to explain a modified example of measurement points 10B in the stand-alone registration detection apparatus 12.

Further, in each of the built-in registration detection apparatus 11 and the stand-alone registration detection apparatus 12, a detection stage 41, an optical system 42, a camera 43, and an image processing part 44 shown in FIG. 3 are provided. The detection stage 41 supports the substrate 10A. The optical system 42 forms an optical image of each local area (measurement point 10B) of the substrate 10A. The camera 43 captures the optical image of the substrate 10A by a not-shown image sensor to output an image capturing signal to the image processing part 44. When acquiring the image capturing signal from the camera 43, the image processing part 44 converts the optical image to a digital image, applies predetermined signal processing to this image, and calculates a registration discrepancy amount at the measurement point 10B.

As described above, the built-in registration detection apparatus 11 and the stand-alone registration detection apparatus 12 have the same basic structure. However, in the built-in registration detection apparatus 11, a driving part, a vibration isolation system, and so on of the detection stage 41 are smaller than those of the stand-alone registration detection apparatus 12, due to the restriction of space for built-in installation in the lithography system 20. Therefore, processing capability of the built-in registration detection apparatus 11 is lower than that of the stand-alone registration detection apparatus 12.

Further, in the built-in registration detection apparatus 11, the number of measurement items at each of the measurement points 10B is made smaller than that in the stand-alone registration detection apparatus 12 in order to shorten a required time for each of the measurement points 10B of the substrate 10A. Specifically, the built-in registration detection apparatus 11 performs the measurement at each of the measurement points 10B, with the substrate 10A only in an attitude at a positive orientation (0 degree orientation), while the stand-alone registration detection apparatus 12 performs the measurement at each of the measurement points 10B, with the substrate 10A both in the attitude at the positive orientation (0 degree orientation) and in an attitude at the opposite orientation (180 degree orientation). The opposite orientation measurement omitted in the built-in registration detection apparatus 11 is measurement relating to the setting of an error component arising from the apparatus (TIS value: Tool Induced Shift).

Further, the database 13 connected to the above-structured built-in registration detection apparatus 11 and stand-alone registration detection apparatus 12 stores a recipe for the built-in registration detection apparatus 11 and a recipe for the stand-alone registration detection apparatus 12 in advance. Each of the recipes is a file in which positional information of each of the measurement points 10B (FIG. 2) of the substrate 10A, measurement items at each of the measurement points 10B, and the like are registered. The same positional information of each of the measurement points 10B is registered in the recipe for the built-in registration detection apparatus 11 and in the recipe for the stand-alone registration detection apparatus 12. Further, the number of the measurement items at each of the measurement points 10B is smaller in the built-in registration detection apparatus 11 than in the stand-alone registration detection apparatus 12.

Further, in the recipe for the built-in registration detection apparatus 11, the TIS values ($T1_{ij}$) of the registration detection apparatus 11 are also registered as well as the above-described positional information and measurement items. The suffix i represents a number assigned to each of the shot areas of the substrate 10A, and the suffix j represents a number assigned to each of the measurement points 10B in the short area. That is, in this embodiment, the TIS value ($T1_{ij}$) of each of the measurement points 10B of the substrate 10A can be registered. Incidentally, in the recipe for the stand-alone registration detection apparatus 12, such TIS values are not registered.

Further, the recipe for the built-in registration detection apparatus 11 (the positional information of each of the measurement points 10B, the measurement items at each of the measurement points 10B, and the TIS value ($T1_{ij}$) of each of the measurement points 10B) and the recipe for the stand-alone registration detection apparatus 12 (the positional information of each of the measurement points 10B and the measurement items at each of the measurement points 10B) are stored in correspondence to the kind of a lot (the combination of the product name and the process name). Further, the results of the registration detection (the discrepancy amounts at the measurement points 10B) are also stored in the database 13 in correspondence to the product name, the process name, and the lot number.

Next, the procedure for processing the substrate 10A in the lithography system 20 and the detection procedure for the substrate 10A in the registration detection system 10 of this embodiment will be described.

When the transport container 14 is set in the loader/unloader part 31 of the coater/developer 22, this is notified to the factory host 24 via the machine controller 23. The factory host 24 refers to the product name, the process name, and so on of the set transport container 14 and instructs, to the machine controller 23, resist coating criteria, exposure criteria, development criteria, detection criteria, and so on suitable for the substrates 10A in the transport container 14. At this time, the factory host 24 outputs the product name, the process name, and the lot number together with the various criteria to the machine controller 23.

Based on the instruction from the factory host 24, the machine controller 23 gives instructions to the exposure apparatus 21 and the coater/developer 22 and also gives an instruction to the not-shown transport mechanism. Consequently, as instructed from the factory host 24, the substrate 10A is taken out of the transport container 14 in the loader/unloader part 31, the substrate 10A is coated with resist in the coater 32, the latent image of the circuit pattern is formed on the resist layer in the exposure apparatus 21, the resist layer is developed in the developer 33, the registration detection (to be described next in detail) is performed in the built-in registration detection apparatus 11, and the substrate 10A is collected in the transport container 14.

In the built-in registration detection apparatus 11, based on the instruction from the factory host 24, the recipe for the registration detection apparatus 11 (the positional information of each of the measurement points 10B, the measurement items at each of the measurement points 10B, and the TIS value ($T1_{ij}$) of each of the measurement points 10B) corresponding to the product name and the process name of the current lot is read from the database 13.

Then, when the substrate 10A after passing through the development process is placed on the detection stage 41, the measurement points 10B (FIG. 2) are aligned in sequence in a field of view of the apparatus according to the positional information registered in the recipe. Further, at each of the measurement points 10B, the registration detection is performed according to the measurement items registered in the recipe. Further, in the built-in registration detection apparatus 11, the TIS values ($T1_{ij}$) registered in the recipe are set as the criteria for the registration detection, and according to the criteria, the registration detection is performed.

Specifically, with the substrate 10A in an attitude at a positive orientation (0 degree orientation), the built-in registration detection apparatus 11 acquires an image of each of the measurement points 10B (first acquisition unit) and applies predetermined signal processing to the image, thereby calculating a registration discrepancy amount at each of the measurement points 10B (first calculation unit). The registration discrepancy amount at each of the measurement points 10B calculated at this time is defined as $S1_{nij}$. The suffix n represents a number assigned to the substrate 10A, the suffix i represents a number assigned to each shot area of the substrate 10A, and the suffix j represents a number assigned to each of the measurement points 10B in the shot area.

Further, using the TIS value ($T1_{ij}$) registered in the recipe, the built-in registration detection apparatus 11 corrects the registration discrepancy amount ($S1_{nij}$) at each of the measurement points 10B according to the following expression (1) (first correction unit). A registration discrepancy amount ($R1_{nij}$) after the correction using the TIS value ($T1_{ij}$) is the result of the registration detection by the built-in registration detection apparatus 11. The built-in registration detection apparatus 11 outputs, to the machine controller 23, the registration discrepancy amount ($R1_{nij}$) after the correction for use in the correction of the exposure process.

$$R1_{nij}=S1_{nij}-T1_{ij} \tag{1}$$

Further, the registration discrepancy amount ($R1_{nij}$) after the correction is outputted also to the database 13 from the built-in registration detection apparatus 11 and is stored in correspondence to the number n of the substrate 10A, the number i of the shot area, and the number j of the measurement point 10B. In this case, the product name, the process name, and the lot number are also stored together with the registration discrepancy amounts ($R1_{nij}$) after the correction, and are used as an index when this result is referred to.

The substrates 10A after passing through the development process are placed in sequence on the detection stage 41 of the built-in registration detection apparatus 11, and the same registration detection as above is repeated for all (for example, 25 pieces of) the substrates 10A in the transport container 14 (total detection). At this time, the common TIS value ($T1_{ij}$) is used for the substrates 10A in the same transport container 14. Then, the registration discrepancy amount ($R1_{nij}$) after the correction of each of the substrates 10A is outputted to the machine controller 23 for use in the correction of the exposure process and is also outputted to the database 13 (n=1~25).

Here, in order to improve a nondefective ratio of the current lot, the registration discrepancy amount ($R1_{nij}$) of each of the substrates 10A outputted from the built-in registration detection apparatus 11 to the machine controller 23 is fed back, substrate by substrate, to the exposure process for each of the substrates 10A in the lot to be used for the correction of the exposure process of the subsequent substrate 10A (the substrate 10A to be subsequently transported to the exposure apparatus 21). Incidentally, based on the registration discrepancy amount ($R1_{nij}$) of each of the substrates 10A, the machine controller 23 generates compensation data (an offset component, a scaling component, a rotation component, and the like) for the exposure apparatus 21 and corrects the exposure process so as to reduce the process offset of the exposure process.

Then, when the lithography process (the resist coating process, the exposure process, the development process, and so on) and the detection process by the built-in registration detection apparatus 11 for all (for example, 25 pieces of) the substrates 10A in the transport container 14 are finished, the exposure apparatus 21 and the coater/developer 22 notify this to the factory host 24 via the machine controller 23. Further, when all the substrates 10A are collected in the transport container 14, the factory host 24 instructs the external automatic transport apparatus (not shown) or the operator to carry out the transport container 14 out of the loader/unloader part 31.

As described above, in the built-in registration detection apparatus 11, at each of the measurement points 10B of each of the substrate 10A, the image of the measurement point 10B is acquired, with the substrate 10A only in the attitude at the positive orientation (0 degree orientation), to calculate the registration discrepancy amount $S1_{nij}$, and the measurement relating only to the registration detection itself is executed. That is, at each of the measurement points 10B, the measurement (measurement relating to the setting of the TIS value) at the opposite orientation (180 degree orientation) is omitted. This can shorten the required time at each of the measurement points 10B. Therefore, even if the number of the measurement points of each of the substrates 10A is not decreased, it is possible to perform the registration detection of each of the substrates 10A in the lot without lowering an original throughput of the lithography system 20. Moreover, since the number of the measurement points of each of the substrates 10A is not decreased, high accuracy registration detection usable for the correction of the exposure process is enabled.

Thereafter, when the transport container 14 carried out of the loader/unloader part 31 of the lithography system 20 is set in the stand-alone registration detection apparatus 12, this is notified to the factory host 24. The factory host 24 refers to the product name, the process name, and so on of the set transport container 14 to instruct detection criteria and so on suitable for the substrates 10A in the transport container 14. At this time, the factory host 24 outputs the product name, the process name, and the lot number of the lot to the stand-alone registration detection apparatus 12.

In the stand-alone registration detection apparatus 12, based on the instruction from the factory host 24, the recipe for the registration detection apparatus 12 (the positional information of each of the measurement points 10B and the measurement items at each of the measurement points 10B) corresponding to the product name and the process name of the current lot is read from the database 13. Then, when the substrate 10A newly taken out from the transport container 14 is placed on the detection stage 41, the measurement points 10B (FIG. 2) are aligned in a field of view of the apparatus in sequence according to the positional information registered in the recipe. Further, at each of the measurement points 10B, the registration detection is performed according to the measurement items registered in the recipe.

Specifically, the stand-alone registration detection apparatus 12 acquires a first image of the measurement point 10B, with the substrate 10A in the attitude at the positive orientation (0 degree orientation) and also acquires a second image of the measurement point 10B, with the substrate 10A rotated by an angle of 180 degrees from the positive orientation (that is, in an attitude at the opposite orientation (180 degree orientation)) (second acquisition unit).

Then, predetermined signal processing is applied to the first image, whereby a registration discrepancy amount at the measurement point 10B is calculated (third calculation unit). Further, the same signal processing is applied to the second image, whereby a registration discrepancy amount at the measurement point 10B is calculated. The registration discrepancy amount at the positive orientation calculated at this time from the first image is defined as $S2_{nij}$, and the registration discrepancy amount at the opposite orientation calculated from the second image is defined as $H2_{nij}$. The suffix n represents a number assigned to the substrate 10A, the suffix i is a number assigned to each of the shot areas, and the suffix j is a number assigned to each of the measurement points 10B in the shot area.

Further, based on both of the registration discrepancy amount ($S2_{nij}$) at the positive orientation and the registration discrepancy amount ($H2_{nij}$) at the opposite orientation, the stand-alone registration detection apparatus 12 calculates a TIS value ($T2_{ij}$) of the registration detection apparatus 12 at each of the measurement points 10B, according to the following expression (2) (second calculation unit). The suffix i represents a number assigned to each of the shot areas of the substrate 10A, and the suffix j represents a number assigned to each of the measurement points 10B in the shot area.

$$T2_{ij}=(S2_{nij}+H2_{nij})/2 \quad (2)$$

Further, the stand-alone registration detection apparatus 12 sets the TIS value ($T2_{ij}$) which is the above calculation result, as criteria for the registration detection, and continues the registration detection according to the criteria. Specifically, according to the following expression (3), the registration discrepancy amount at the positive orientation ($S2_{nij}$) at each of the measurement points 10B is corrected using the above TIS value ($T2_{ij}$) at each of the measurement points 10B (second correction unit). A registration discrepancy amount ($R2_{nij}$) after the correction using the TIS value ($T2_{ij}$) is the result of the registration detection by the stand-alone registration detection apparatus 12.

$$R2_{nij}=S2_{nij}-T2_{ij} \quad (3)$$

$$[=(S2_{nij}-H2_{nij})/2]$$

The registration discrepancy amount ($R2_{nij}$) after the correction is outputted from the stand-alone registration detection apparatus 12 to the database 13 and is stored in correspondence to the number n of the substrate 10A, the number i of the shot area, and the number j of the measurement point 10B. Also in this case, the product name, the process name, and the lot number are stored together with the registration discrepancy amount ($R2_{nij}$) after the correction and are used as an index when this result is referred to.

In this embodiment, the above-described registration detection by the stand-alone registration detection apparatus 12 is performed for one of the substrates 10A (for example, n=3) sampled from the transport container 14. When the above-described registration detection of the predetermined substrate 10A is finished, the stand-alone registration detection apparatus 12 notifies this to the factory host 24. Thereafter, the factory host 24 instructs the automatic transport apparatus (not shown) or the operator to carry out the transport container 14. Incidentally, the substrates are carried in a unit of lot to a subsequent process (processing process or the like) if judged as good as a result of the detection in the stand-alone registration detection apparatus, or to a reproduction process or a discard process if judged as bad.

When the above-described sampling detection is finished, the stand-alone registration detection apparatus 12 refers to the detection result stored in the database 13 to correct the TIS value ($T1_{ij}$) registered in the recipe for the built-in registration detection apparatus 11 stored in the database 13. This correction processing will be described next. Out of the detection results by the built-in detection apparatus 11 and the detection results by the stand-alone detection apparatus 12, the detection results with the same product name, process name, lot number and with the same number n of the substrate 10A are referred to. The TIS value ($T1_{ij}$) to be corrected is that registered in the recipe with the same product name and process name as those of the referred detection results.

In the following description, it is assumed that two kinds of the detection results on the same substrate 10A with, for example, n=3, that is, the detection result ($R1_{3ij}$) by the built-in registration detection apparatus 11 and the detection result ($R2_{3ij}$) by the stand-alone registration detection apparatus 12 are referred to, and the TIS value ($T1_{ij}$) registered in the recipe for the built-in registration detection apparatus 11 stored in the database 13 is corrected.

The stand-alone registration detection apparatus 12 refers to two kinds of the abovementioned detection results to compare the registration discrepancy amount ($R1_{3ij}$) and the registration discrepancy amount ($R2_{3ij}$) at the same measurement point 10B. That is, the registration discrepancy amount ($R1_{3ij}$) and the registration discrepancy amount ($R2_{3ij}$) of the measurement point 10B with the same number j in the shot area with the same number i of the substrate 10A are compared. As described above, the registration discrepancy amount ($R1_{3ij}$) by the built-in type is a value after the correction using the TIS value ($T1_{ij}$) registered in the recipe in advance. The registration discrepancy amount ($R2_{3ij}$) by the stand-alone type is a value after the correction using the actually measured TIS value ($T2_{ij}$).

Two kinds of the detection results at the same measurement point 10B should have the same value even if different apparatuses are used. However, actually, two kinds of the detection results sometimes slightly differ from each other. This is because the built-in registration detection apparatus 11 calculates the registration discrepancy amount ($R1_{3ij}$) by using the TIS value ($T1_{ij}$) registered in advance in the recipe stored in the database 13. If an actual TIS value of the built-in registration detection apparatus 11 changes according to the time-dependent change of the parts (the optical system 42 and so on) of the apparatus and a cross sectional shape of the mark at each of the measurement points 10B of the substrate 10A and thus does not match the TIS value ($T1_{ij}$) registered in the recipe in advance, there occurs a discrepancy between two kinds of the detection results.

Further, even in a case where two kinds of the detection results are different, the registration discrepancy amount ($R2_{3ij}$) by the stand-alone type is a value after the correction using the actually measured TIS value ($T2_{ij}$) and thus is considered as correct. In a case where two kinds of the detection results differ from each other, a value considered as inaccurate is the registration discrepancy amount ($R1_{3ij}$) by the built-in type. Therefore, based on the registration discrepancy amount ($R2_{3ij}$) by the stand-alone type, the TIS value ($T1_{ij}$) registered in the recipe for the built-in registration detection apparatus 11 stored in the database 13 is corrected so as to make the registration discrepancy amount ($R1_{3ij}$) by the built-in type match the registration discrepancy amount ($R2_{3ij}$) by the stand-alone type.

Concretely, according to the following expression (4), a difference $\Delta T_{ij}$ between the registration discrepancy amount ($R1_{3ij}$) and the registration discrepancy amount ($R2_{3ij}$) which are calculated by the built-in type and the stand-alone type at the same measurement point 10B of the same substrate 10A (for example, n=3) is found, and then, according to the following expression (5), the difference $\Delta T_{ij}$ is added to the TIS value (old $T1_{ij}$) in the database 13, whereby the correction processing is performed. Then, the recipe for the built-in registration detection apparatus 11 stored in the database 13 is updated by the obtained TIS value (new $T1_{ij}$). Such correction processing is performed for each of the measurement points 10B (20 points in the example in FIG. 2) of the substrate 10A.

$$\Delta T_{ij}=R1_{3ij}-R2_{3ij} \quad (4)$$

$$\text{new } T1_{ij}=\text{old } T1_{ij}+\Delta T_{ij} \quad (5)$$

As described above, in the registration detection system 10 of this embodiment, the registration discrepancy amount ($R1_{3ij}$) calculated by the built-in type, which can change according to the time-dependent change of the parts (optical system 42 and so on) of the apparatus and the cross-sectional shape of the mark at each of the measurement points 10B of the substrate 10A, is compared with the correct registration discrepancy amount ($R2_{3ij}$) calculated by the stand-alone type after the stand-alone registration detection apparatus 12 performs the detection, and the TIS value ($T1_{ij}$) registered in the recipe for the built-in registration detection apparatus 11 is corrected so as to make the both match each other. Therefore, the time-dependent change of the actual TIS value in the built-in registration detection apparatus 11 can be reflected in a subsequent lot with the same product name and the same process name, and consequently, the difference between the TIS value ($T1_{ij}$) in the recipe and the actual TIS value can fall within a stable range. As a result, the detection criteria in the built-in registration detection apparatus 11 become stable, and accordingly, it is possible to avoid deterioration in detection accuracy.

That is, even in a case where, in the built-in registration detection apparatus 11, the measurement relating to the setting of the TIS value (the measurement at the opposite orientation (180 degree orientation)) is omitted and the registration discrepancy amount $S1_{nij}$ is calculated by using the TIS value ($T1_{ij}$) registered in the recipe, since the TIS value ($T1_{ij}$) registered in the recipe is corrected in a unit of lot in cooperation with the stand-alone registration detection apparatus 12, there occurs no situation where the time-dependent change of the detection accuracy in the built-in registration detection apparatus 11 becomes problematic, and high detection accuracy, which is usable for the correction of the exposure process can be maintained.

Therefore, in the built-in registration detection apparatus 11, with the maximum use of its processing capability, it is possible to continue executing the registration detection of each of the substrates 10A in the lot with high accuracy usable for the correction of the exposure process, without lowering an original throughput of the lithography system 20. Therefore, in the lithography system 20, the result of the registration detection of each of the substrates 10A can be quickly fed back to the exposure apparatus 21 substrate by substrate, which enables more stable manufacture of devices such as semiconductor devices.

Further, in the registration detection system 10 of this embodiment, the built-in registration detection apparatus 11 and the stand-alone registration detection apparatus 12 perform the registration detection at one or more of the same measurement points 10B of each of the substrates 10A, and the TIS value ($T1_{ij}$) is corrected based on the difference $\Delta T_{ij}$ between the registration discrepancy amount ($R1_{3ij}$) and the registration discrepancy amount ($R2_{3ij}$) calculated by the built-in type and the stand-alone type at the same measurement point 10B, which can simplify the correction processing.

Modified Examples

The above embodiment has described the example where the measurement points 10B of each of the substrate 10A for the built-in registration detection apparatus 11 and those for the stand-alone registration detection apparatus 12 are the same (FIG. 2), but the present invention is not limited to this. The present invention is also applicable to a case where the measurement points 10B for the stand-alone type is set larger in number so as to include all the measurement points 10B for the built-in type. For example, in a case where the measurement points 10B for the built-in type are points represented by the o marks shown in FIG. 2, it is conceivable to set points represented by the o marks shown in FIG. 3 as the measurement points 10B for the stand-alone type. In FIG. 3, portions surrounded by the dotted circles are newly added measurement points 10B.

Further, the above embodiment has described the example where the stand-alone registration detection apparatus 12 performs the registration detection of one of the substrates 10 selectively taken out from the transport container 14, but the present invention is not limited to this. The present invention is also applicable to a case where the number of the substrates measured by the stand-alone registration detection apparatus 12 is two or more. In this case, at the time of the correction of the TIS value ($T1_{ij}$) in the recipe for the built-in registration detection apparatus 11, the difference ($\Delta T1_{ij}$) between two kinds of the detection results ($R1_{nij}$ and $R2_{nij}$) at the same measurement point 10B of the same substrate 10A is found, and such a difference ($\Delta T1_{nij}$) is similarly calculated for each of the two substrates 10A or more, and the obtained differences ($\Delta T1_{nij}$) at the measurement point 10B with the same number ij of the different substrates 10A are averaged, and the result thereof is used as the aforementioned difference $\Delta T_{ij}$ (refer to the expression (5)).

Further, the above embodiment has described the example where the TIS value ($T1_{ij}$) registered in the recipe for the built-in registration detection apparatus 11 is common to the substrates 10A, but the present invention is not limited to this. Different TIS values ($T1_{nij}$) may be prepared for the respective substrates 10A. In this case, the stand-alone registration detection apparatus 12 also needs to perform the total detection similarly to the built-in registration detection apparatus 11. However, the present invention is also applicable to a case where the built-in registration detection apparatus 11 performs sampling detection (for example, performs the registration detection of every other substrate 10A), and in this case, the stand-alone registration detection apparatus 12 only has to perform the registration detection of the substrates 10A that are the detection objects in the built-in registration detection apparatus 11.

Further, the above embodiment has described the example where the TIS value ($T1_{ij}$) registered in the recipe for the built-in registration detection apparatus 11 differs depending on each of the measurement points 10B, but the present invention is not limited to this. A common TIS value (T1) may be prepared for the measurement points 10B of the substrate 10A according to a mode of the recipe for the built-in registration detection apparatus 11. In this case, the difference ($\Delta T_{ij}$) between two kinds of the detection results ($R1_{nij}$ and $R2_{nij}$) at the same measurement point 10B of the substrate 10A is found, an average value ($\Delta$Tave) of the differences ($\Delta T_{ij}$) in the substrate 10A is found, and based on this average value, the TIS value registered in the recipe for the built-in registration detection apparatus 11 is corrected (new T1=old T1+$\Delta$Tave). In such a modified example, at least one of the measurement points 10B for the built-in type needs to be the measurement point 10B for the stand-alone type, and the number of the measurement points 10B for the stand-alone type can be sometimes smaller than that for the built-in type.

Further, in the above-described embodiment, two kinds of the detection results with the same lot number are compared at the time of the correction of the TIS value ($T1_{ij}$) registered in the recipe for the built-in registration detection apparatus 11, but the preset invention is not limited to this. An average value at each of the measurement points 10B found from past detection results of a plurality of lots in the stand-alone registration detection apparatus 12 may be compared with the detection result by the built-in type. Further, an estimated value of the detection result of a subsequent lot may be found by estimating variation among lots from the past detection results of a plurality of lots and this estimated value may be compared with the detection result by the built-in type. The use of the average value or the estimated value can reduce the influence of data at a singular point of the variation, which enables more stable correction of the TIS value.

Further, the above embodiment has described the example where the TIS value is corrected by comparing the registration discrepancy amount ($S1_{nij}$) calculated by the built-in registration detection apparatus 11 with the registration discrepancy amount ($S2_{nij}$) calculated by the stand-alone registration detection apparatus 12, but the present invention is not limited to this. Each of the built-in registration detection apparatus 11 and the stand-alone registration detection apparatus 12 may generate the compensation data (the offset component, the scaling component, the rotation component, and so on) for the exposure apparatus 21 and the TIS value may be corrected by comparing these data.

Further, the above embodiment has described the example where the machine controller 23 generates the compensation data (the offset component, the scaling component, the rotation component, and so on) for the exposure apparatus 21 based on the registration discrepancy amount ($R1_{nij}$) outputted from the built-in registration detection apparatus 11, but the present invention is not limited to this. The present invention is also applicable to a case where the built-in registration detection apparatus 11 generates the compensation data for the exposure apparatus 21 based on the registration discrepancy amount ($R1_{nij}$) to output this as the result of the registration detection to the machine controller 23.

Further, in the above embodiment, the TIS value registered in the recipe for the built-in registration detection apparatus 11 is corrected based on the comparison with the detection result by the stand-alone registration detection apparatus 12, but the present invention is not limited to this. The present invention is also applicable to a case where a focus offset or the like, not limited to the TIS value, is corrected based on the comparison with the detection result by the stand-alone registration detection apparatus 12. In the present application, all of these TIS value, focus offset, and the like correspond to "the criteria for the registration detection".

Further, the above embodiment has described the example where the stand-alone registration detection apparatus 12 compares two kinds of the detection results in the database 13 to correct the TIS value, but the present invention is not limited to this. The present invention is also applicable to a case where another computing apparatus connected to the database 13 compares two kinds of the detection results in the database 13 to correct the TIS value.

Further, in the above embodiment, the database 13 is installed outside the lithography system 20 and the registration detection system 10, but the present invention is not limited to this. The present invention may have a structure in which, by using at least one of memory units installed inside the built-in registration detection apparatus 11 and the stand-alone registration detection apparatus 12, data (detection result) is stored in this memory unit, and the other measurement detection apparatus is capable of writing and reading data thereto/therefrom. The two detection apparatuses (11, 12) may directly communicate with each other to compare two kinds of the detection results.

Further, in the above embodiment, the one built-in registration detection apparatus 11 and the one stand-alone registration detection apparatus 12 are provided, but at least either of the two detection apparatuses (11, 12) may be provided in plurality.

The invention is not limited to the above embodiments and various modifications may be made without departing from the spirit and scope of the invention. Any improvement may be made in part or all of the components.

What is claimed is:

1. A registration detection system, comprising:
a first detection apparatus that is installed on the pathway to a collection in a transport container of substrates that are taken out of the transport container, after passing at least through an exposure process and a development process, performs registration detection in accordance with stipulated criteria of a resist pattern and a base pattern of said substrates after passing through said development process, and outputs results of said registration detection results for use in correction of said exposure process;
a second detection apparatus situated outside of said pathway, and performing registration detection of the resist pattern and the base pattern of said substrates; and
a criteria correction unit that compares the results of the registration detection performed by said first detection apparatus and the results of the registration detection performed by said second detection apparatus and performs correction on the criteria for the registration detection by said first detection apparatus based on the registration detection from said second detection apparatus.

2. The registration detection system in claim 1,
wherein said first detection apparatus comprises:
a memory unit that stores an error component arising from said first detection apparatus;
a first acquisition unit that acquires an image of a measurement point of said substrate, with said substrate in an attitude at a stipulated orientation; and
a correction unit that corrects the registration discrepancy amount based on said error component stored in said memory unit; and
wherein said second detection apparatus comprises:
a second acquisition unit that acquires a first image of the measurement point of said substrate with said substrate in an attitude at a stipulated orientation, and a second image of said measurement point with said substrate rotated by an angle of 180 degrees from the stipulated orientation of said substrate;
along with a second calculation unit that calculates an error component arising from said second detection apparatus based on both of said first image and said second image;
a third calculation unit that calculates a registration discrepancy amount at said measurement point based on said first image or said second image; and
a second correction unit that corrects said registration discrepancy amount based on said error component calculated by said second calculation unit; and
wherein said criteria correction unit corrects said error component stored in said memory unit, out of the registration detection criteria employed by said first detection apparatus.

3. The registration detection system in claim 2,
wherein said first detection apparatus and said second detection apparatus respectively perform the registration detection at one or more of the same measurement points of said substrate, and
wherein said criteria correction unit calculates a difference between the two corrected criteria at said same measurement points, with said registration discrepancy amount corrected by said first correction unit used as the registration detection result for said first detection apparatus, and said registration discrepancy amount corrected by said second correction unit used as the registration detection result for said second detection apparatus, when comparing the registration detection results of said first detection apparatus with those of said second detection apparatus.

4. The registration detection system in claim 1, wherein said first detection apparatus is placed inside an application/development apparatus that applies resist prior to said exposure process and develops said resist after said exposure process, and
wherein said second detection apparatus is placed outside said application/development apparatus.

5. The registration detection system in claim 2, wherein said first detection apparatus is placed inside an application/development apparatus that applies resist prior to said exposure process and develops said resist after said exposure process, and
wherein said second detection apparatus is placed outside said application/development apparatus.

6. The registration detection system in claim 3, wherein said first detection apparatus is placed inside an application/development apparatus that applies resist prior to said exposure process and develops said resist after said exposure process, and
wherein said second detection apparatus is placed outside said application/development apparatus.

7. A method, comprising:
incorporating a first apparatus inline with a lithography system;
transporting a lot comprising at least one substrate to said lithography system;
performing a lithography process to said substrate;
performing registration detection with said first apparatus post said lithography process in accordance with predetermined criteria of a resist pattern and a base pattern on said substrate to generate a first registration detection result;
generating correction data from said first registration detection result for correcting said criteria for registration detection on each substrate;
providing a second apparatus outside said lithography system;
performing a second registration detection on said resist pattern with said second apparatus and said base pattern of said substrate to generate a second registration detection result;
comparing a result of the registration detection performed by said first apparatus and a result of the registration detection performed by said second apparatus; and
correcting said criteria using said first registration detection result based on the registration detection from said second apparatus.

8. The method in claim 7, wherein said lithography process comprising:
performing a resist application process to said substrate;
performing an exposure process to said substrate to burn a latent image onto said resist; and
performing a developing process to said substrate.

9. The method in claim 7, wherein said correcting comprises reducing offsets between a latent image and a base image on said substrate.

10. The method in claim 7, further comprising storing said first registration detection result in a memory.

11. The method in claim 7, further comprising storing a recipe in a memory couple to said first apparatus and said second apparatus, wherein each recipe comprises position data for each measurement point for said first apparatus and said second apparatus.

12. The method in claim 11, wherein said recipe further comprises said criteria for each measurement point.

13. The method in claim 12, wherein said criteria comprises TIS values for each measurement point for said first apparatus.

14. The method in claim 11, wherein said recipe further comprises relational data for said substrate.

15. The method in claim 7, wherein said performing registration detection comprises:
calculating an error component from said first registration detection result;
storing said error component in a memory;
acquiring an image at a measurement point at a first orientation; and
correcting a registration discrepancy based on said error component.

16. The method of claim 15, wherein said performing second registration detection comprises:
acquiring a first image at said measurement point at said first orientation;
acquiring a second image at said measurement point at a second orientation, said second orientation being 180 degrees from said first orientation;
calculating a second error component from said second registration detection based on said first image and said second image;
storing said second error component in a second memory; and
correcting a second registration discrepancy using said second error component.

17. The method of claim 7, further comprising:
comparing said first registration detection result and said second registration detection result at the same measurement point on at least one substrate; and
calculating a difference between two corrected criteria at said same measurement point.

18. A registration detection system, comprising:
a lithography system comprising:
an exposure device for performing an exposure process;
a develop device for performing a developing process; and
a first apparatus incorporated inline with said lithograph system for performing registration detection on a substrate in accordance with predetermined criteria after performance of said exposure process and developing process, said first apparatus outputting a first registration detection result for use in correction of said exposure process;
a second detection apparatus situated outside of said lithography system for performing registration detection on a resist pattern and a base pattern of said substrates; and
a processor for calculating correction data for correcting criteria for said registration detection using said first registration detection result based on the registration detection from said second detection apparatus.

19. The registration detection system of claim 18, further comprising a second processor for calculating correction data for correcting criteria for said registration detection using said first registration detection result and said second registration detection result.

* * * * *